US011861283B2

United States Patent
Tsai et al.

(10) Patent No.: US 11,861,283 B2
(45) Date of Patent: Jan. 2, 2024

(54) PLACEMENT METHOD AND NON-TRANSITORY COMPUTER READABLE STORAGE MEDIUM

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Chen-Fa Tsai, Hsinchu (TW); Che-Li Lin, Hsinchu (TW); Chia-Min Lin, Tainan (TW); Chung-Wei Huang, Tainan (TW); Liang-Chi Zane, Tainan (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 283 days.

(21) Appl. No.: 17/455,013

(22) Filed: Nov. 15, 2021

(65) Prior Publication Data

US 2023/0046865 A1 Feb. 16, 2023

(30) Foreign Application Priority Data

Aug. 11, 2021 (TW) .................................. 110129658

(51) Int. Cl.
*G06F 30/00* (2020.01)
*G06F 30/394* (2020.01)
(Continued)

(52) U.S. Cl.
CPC .......... *G06F 30/394* (2020.01); *G06F 30/392* (2020.01); *G06F 30/3947* (2020.01)

(58) Field of Classification Search
CPC ... G06F 30/394; G06F 30/392; G06F 30/3947
See application file for complete search history.

(56) References Cited

U.S. PATENT DOCUMENTS

| 6,085,032 A | * | 7/2000 | Scepanovic | G06F 30/392 716/135 |
| 6,480,991 B1 | * | 11/2002 | Cho | G06F 30/392 716/124 |

(Continued)

FOREIGN PATENT DOCUMENTS

CN     107526860 B  * 12/2019  ........... G06F 30/392

OTHER PUBLICATIONS

C.-K. Cheng, A. B. Kahng, I. Kang, and L. Wang, "RePlAce: Advancing Solution Quality and Routability Validation in Global Placement," IEEE Transactions On Computer-Aided Design of Integrated Circuits and Systems, vol. 38, No. 9, 2019, pp. 1717-1730.

(Continued)

*Primary Examiner* — Naum Levin
(74) *Attorney, Agent, or Firm* — CKC & Partners Co., LLC (57) ABSTRACT

A placement method for integrated circuit design is provided. Each net is considered as a soft module. The net will receive a larger penalty if it covers more routing congested regions. Therefore, it is easier to move the nets away from routing congested regions. In addition, to relieve local congestion, a novel inflation method is proposed to expand the area of a cluster according to its internal connectivity intensity and routing congestion occupied by the cluster. Accordingly, it can get better routability and wirelength.

9 Claims, 9 Drawing Sheets

(51) Int. Cl.
*G06F 30/3947* (2020.01)
*G06F 30/392* (2020.01)

(56) References Cited

U.S. PATENT DOCUMENTS

| | | | | |
|---|---|---|---|---|
| 7,117,468 B1 * | 10/2006 | Teig | ..................... | G06F 30/394 |
| | | | | 716/129 |
| 8,863,062 B2 * | 10/2014 | Chuang | ................ | G06F 30/392 |
| | | | | 716/118 |
| 2022/0091580 A1 * | 3/2022 | Bandara | ................ | B29C 64/386 |

OTHER PUBLICATIONS

X. He, Y. Wang, Y. Guo, and E. F. Y. Young, "Ripple 2.0: Improved Movement of Cells in Routability-Driven Placement," ACM Transactions on Design Automation of Electronic Systems, vol. 22, No. 1, Art. No. 10, Sep. 2016.

M.-K. Hsu, Y.-F. Chen, C.-C. Huang, S. Chou, T.-H. Lin, T.-C. Chen, and Y.-W. Chang, "NTUplace4h: A Novel Routability-Driven Placement Algorithm for Hierarchical Mixed-Size Circuit Designs," IEEE Transactions On Computer-Aided Design of Integrated Circuits and Systems, vol. 33, No. 12, Dec. 2014, pp. 1914-1927.

C.-C. Huang, H.-Y. Lee, B.-Q. Lin, S.-W. Yang, C.-H. Chang, S.-T. Chen, Y.-W. Chang, T.-C. Chen and Ismail Bustany, "NTUplace4dr: A Detailed-Routing-Driven Placer for Mixed-Size Circuit Designs with Technology and Region Constraints," IEEE Transactions On Computer-Aided Design of Integrated Circuits and Systems, vol. 37, No. 3, Mar. 2018, pp. 669-681.

Z.-W. Jiang, B.-Y. Su, and Y.-W. Chang, "Routability-Driven Analytical Placement by Net Overlapping Removal for Large-Scale Mixed-Size Designs," in Proc. of DAC, 2008, pp. 167-172.

M.-C. Kim, J. Hu, D. J. Lee, and I. L. Markov, "A SimPLR Method for Routability-driven Placement," in Proc. of ICCAD, 2011, pp. 67-73.

T. Lin and C. Chu, "POLAR 2.0: An Effective Routability-Driven Placer," in Proc. of DAC, 2014.

P. Spindler and F. M. Johannes, "Fast and Accurate Routing Demand Estimation for Efficient Routability-driven Placement," in Proc. of DATE, 2007.

J.-M. Lin, S.-T. Li, and Y.-T. Wang, "Routability-driven Mixed-size Placement Prototyping Approach Considering Design Hierarchy and Indirect Connectivity Between Macros," in Proc. of DAC, 2019.

Chen, Tung-Chieh, et al., "NTUplace3: An Analytical Placer for Large-Scale Mixed-Size Designs With Preplaced Blocks and Density Constraints," IEEE Transactions on Computer-Aided Design of Integrated Circuits and Systems, vol. 27, No. 7, Jul. 2008, pp. 1228-1240.

* cited by examiner

PLACEMENT METHOD AND NON-TRANSITORY COMPUTER READABLE STORAGE MEDIUM

RELATED APPLICATIONS

This application claims priority to Taiwan Application Serial Number 110129658 filed Aug. 11, 2021, which is herein incorporated by reference.

BACKGROUND

Field of Invention

The present invention relates to a placement method of an integration circuit that is capable of resolving global routing congestion and local routing congestion.

Description of Related Art

In the modern very-large-scale integration (VLSI) design, cell placement is still the most important stage in the physical design. Placement result has a direct impact on quality of a chip in terms of wirelength, routability, and timing closure. Although many algorithms have been developed over the past decades, placement remains the most challenging problem and has substantial room for improvement.

Figure 1:
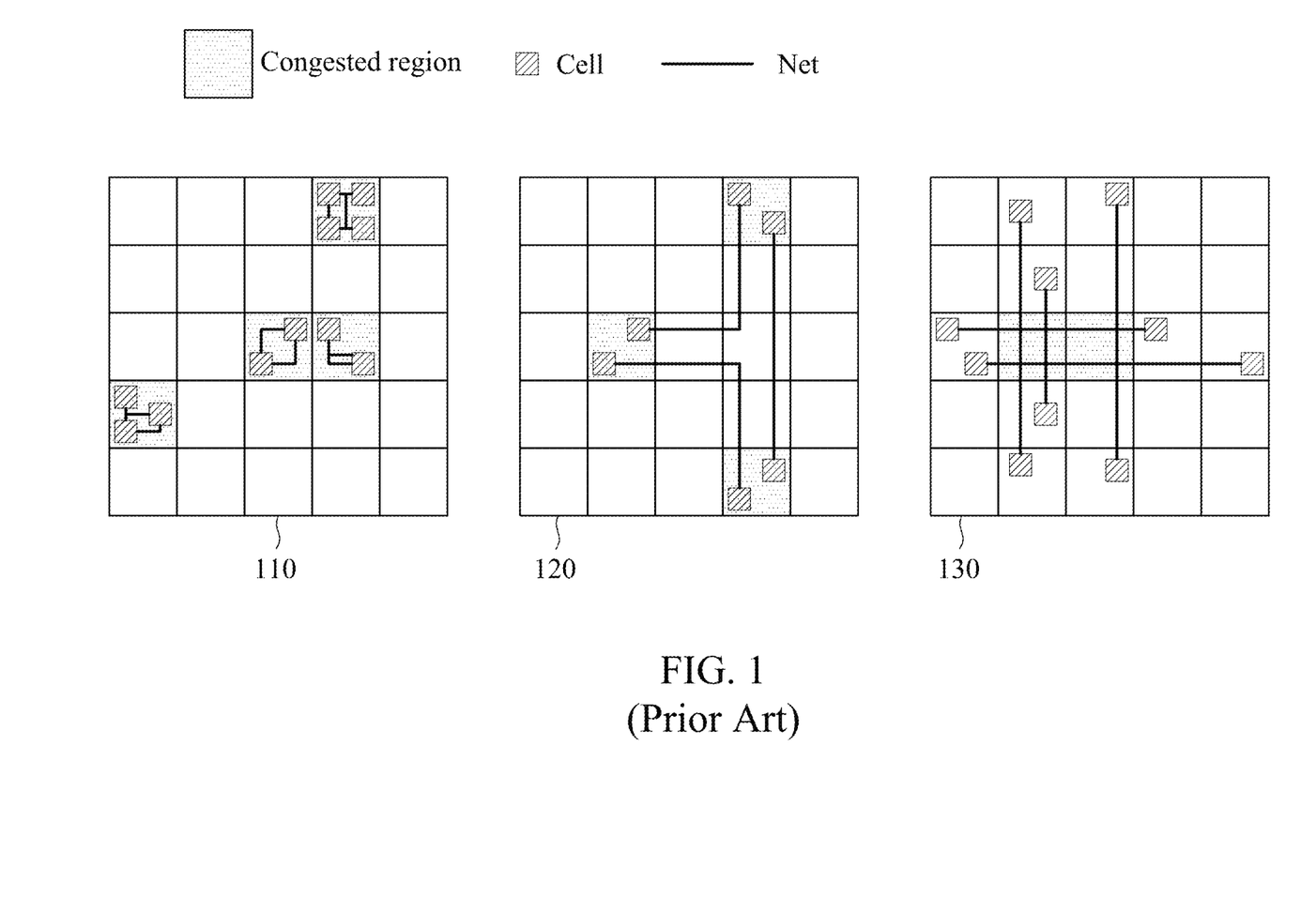
FIG. 1 is a diagram illustrating routing congestions caused by different reasons.

To reduce design complexity, many researches divide placement into three stages, which include global placement (GP), legalization (LG) and detailed placement (DP). The target of GP is to spread standard cells over a placement region while optimizing some specified issues such as wirelength and routability, and its result has a critical impact on the remaining stages. Routing congestion is the primary concern in the contemporary GP algorithm because the quality of a placement has a direct influence on routability during routing. However, routability is rather complicated in placement since routing congestion may come from different sources, named global routing congestion and local routing congestion. FIG. 1 is a diagram illustrating routing congestions caused by different reasons. In scenarios 110, 120, and 130, 25 g-cells are included in the region. The routing congestion may occur in each g-cell, and one routing congested region may include one or more congested g-cell. To be specific, there are four routing congested g-cells (illustrated with dots) in the scenario 110, there are three routing congested g-cells in the scenario 120, and there are two routing congested g-cells in the scenario 130. We consider the scenarios 110 and 120 as local routing congestion because they can be resolved by moving cells away from the congested regions. However, the routing congestion in the scenario 130 cannot be eliminated by moving cells, which is considered as global routing congestion. To be able to solve routing congestion during placement, we must handle global and local routing congestion separately.

SUMMARY

Embodiments of the present disclosure provide a placement method of an integrated circuit design for a computer system. A placement region is divided into multiple grids. Multiple cells form multiple nets and each of the nets connects at least two of the cells. The placement method includes: taking the cells as multiple clusters, and merging the clusters in each of multiple levels from bottom to up; performing an initial placement; and disassembling the clusters in each of the levels from the up to the bottom and performing a first placement procedure. The first placement procedure includes: setting a bounding box for each of the nets, in which the bounding box covers at least one first grid of the grids; for each of the nets, calculating a routing congestion penalty according to an overlapping area between the bounding box and the at least one first grid and an overflow value of the at least one first grid; and establishing a first objective function according to the routing congestion penalties of the nets to determine locations of the clusters so that the first objective function outputs a first optimal value.

In some embodiments, merging the clusters includes: generating a new cluster to contain a first cluster and a second cluster of the clusters; and summing up an internal connectivity intensity of the first cluster, an internal connectivity intensity of the second cluster, and a score between the first cluster and the second cluster to obtain an internal connectivity intensity of the new cluster. The score is negatively related to a number of branches between first cluster and the second cluster.

In some embodiments, when the first cluster or the second cluster belongs to a lowest level of levels, the corresponding internal connectivity intensity is equal to 0. The score is also negatively related to an area of the first cluster and an area of the second cluster.

In some embodiments, the first placement procedure further includes: updating the overflow value of each of the grids; and for each of the clusters, obtaining a second grid of the grids that has a greatest overlapping area with the cluster, calculating an inflation ratio according to the overflow value of the second grid and the internal connectivity intensity of the cluster, and adjusting a size of the cluster according to the inflation ratio.

In some embodiments, the first placement procedure further includes: when calculating the inflation ratio, multiplying the internal connectivity intensity of the corresponding cluster by a weight which is positively related to a current level of the levels.

In some embodiments, the inflation ratio is calculated by following equations.

$$\gamma(c_i^l) = \min\left\{\gamma_{min} + \hat{o}(c_i^l) + \frac{l}{N_L} \times \hat{\eta}(c_i^l), \gamma_{max}\right\}$$

$$\hat{o}(c_i^l) = \max\left\{\frac{o(c_i^l) - o_T}{o_{max}}, 0\right\}$$

$$\hat{\eta}(c_i^l) = \max\left\{\frac{\eta(c_i^l) - \eta_T}{\eta_{max}}, 0\right\}$$

l is the current level, $c_i^l$ is an $i^{th}$ cluster in the current level, $\gamma(c_i^l)$ is the inflation ratio of the cluster $c_i^l$, $N_L$ is a number of the levels. $\gamma_{min}$, $\gamma_{max}$, $o_T$ and $\eta_T$ are predetermined real values. $o(c_i^l)$ is the overflow value of the second grid corresponding to the cluster $c_i^l$. $\eta(c_i^l)$ is the internal connectivity intensity of the cluster $c_i^l$. $o_{max}$ is the greatest overflow value among the grids, and $\eta_{max}$ is the greatest internal connectivity intensity among the clusters.

In some embodiments, the placement method further includes performing a second placement procedure before the first placement procedure. The second placement procedure includes: for each of the cluster, calculating the inflation ratio of the cluster, and adjusting the size of the cluster according to the inflation ratio; and establishing a second objective function to determine the locations of the clusters so that the second objective function outputs a second optimal value. The second objective function does not contain the routing congestion penalties.

In some embodiments, the routing congestion penalty of each of the nets is calculated by the following equation.

$$C_i = \sum_{g_k \in G \cap B_i} \rho_k \times \pi_k$$

$C_i$ is the routing congestion penalty of an $i^{th}$ net of the nets. $B_i$ is the bounding box of the $i^{th}$ net. G is a set formed by the grids. $g_k$ is the at least one first grid that is covered by the bounding box $B_i$. $\rho_k$ is a ratio of the overlapping area between the at least one first grid $g_k$ and the bounding box $B_i$ to an area of the bounding box $B_i$. $\pi_k$ is the overflow value of the at least one first grid $g_k$.

From another aspect, a non-transitory computer readable storage media for storing multiple instructions is provided. The instructions are configured to be executed to perform the aforementioned placement method.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

The using of "first", "second", "third", etc. in the specification should be understood for identifying units or data described by the same terminology, but are not referred to particular order or sequence.

Figure 2:
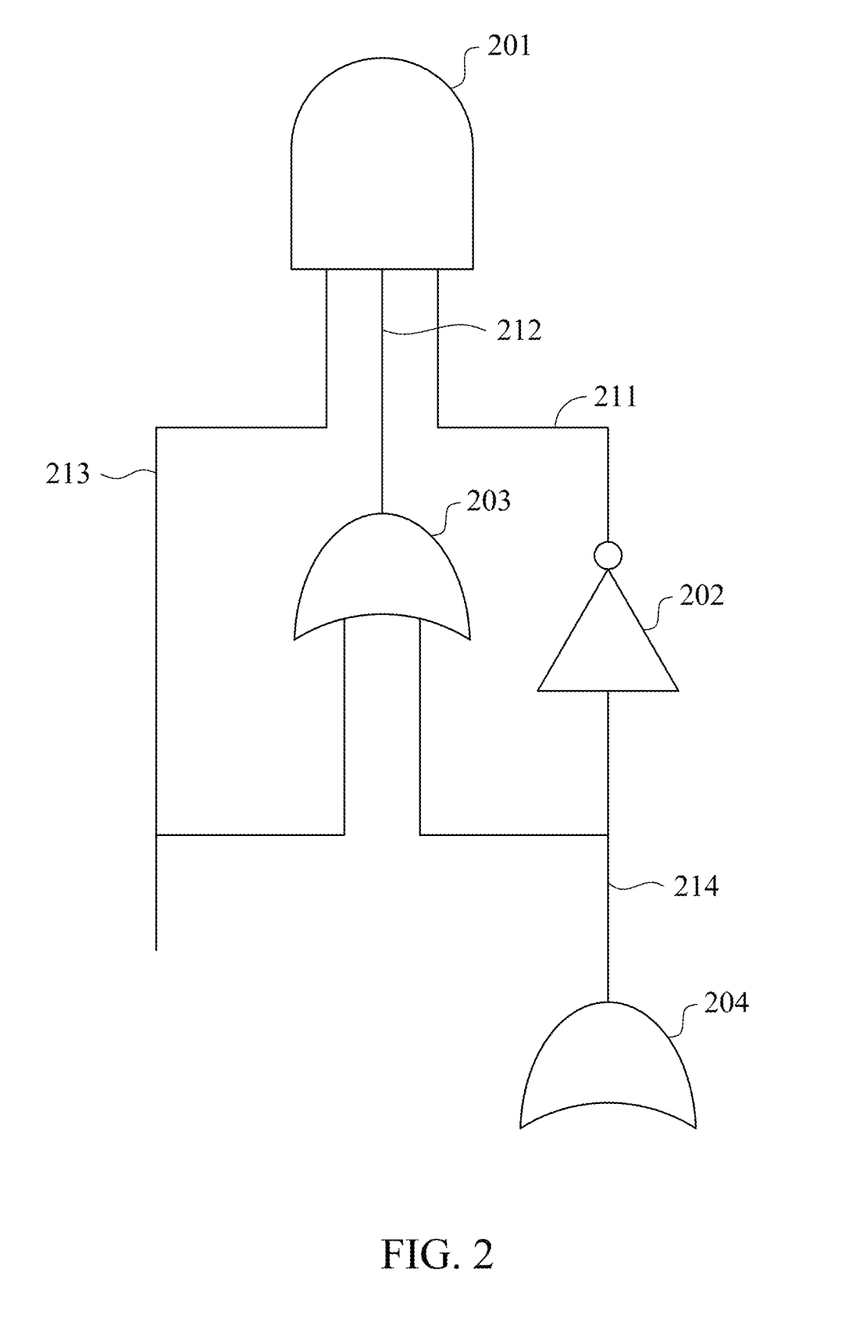
FIG. 2 is a diagram illustrating cells and nets in accordance with an embodiment.

FIG. 2 is a diagram illustrating cells and nets in accordance with an embodiment. Four cells 201-204 are illustrated in FIG. 2. The cells 201-204 form nets 211-214 which are configured to connect pins of the cells 201-204. Each net connects at least two cells. For example, the net 211 connects one input pin of the cell 201 and an output pin of the cell 202, and so on. The number of branches of a net is defined as the number of the connected pins. For example, the number of branches of the net 211 is two, and the number of branches of the net 214 is three. In the embodiment, the cells 201-204 are logic gates, but they may be flip flops or any other suitable circuits in other embodiments.

Figure 3:
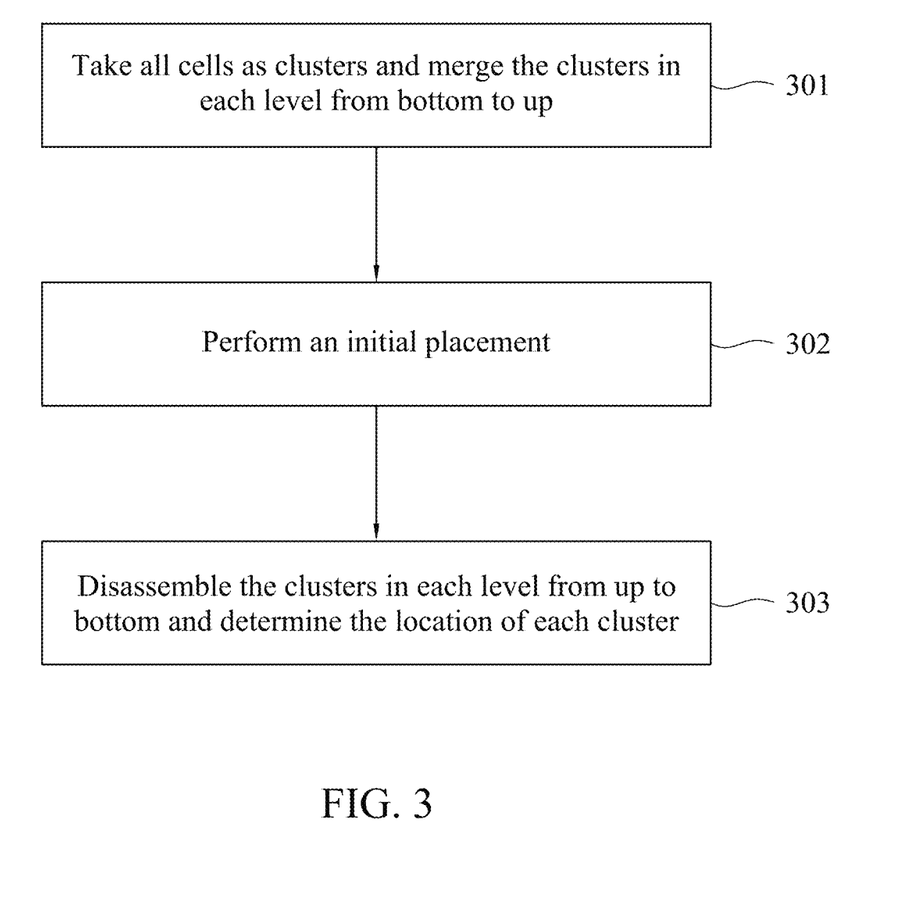
FIG. 3 is a flow chart of a placement method in accordance with an embodiment.

A placement method is provided for spreading the cells in a placement region. FIG. 3 is a flow chart of a placement method in accordance with an embodiment. Referring to FIG. 3, the provided placement method is based on multi-level framework that includes three steps 301-303. The step 301 is also referred to coarsening for taking all cells as clusters and merging the clusters in each level from bottom to up. In the step 302, an initial placement is performed. Any conventional approach such as quadratic placement may be adopted in the step 302. The step 303 is also referred to uncoarsening or refinement for disassembling the clusters in each level from up to bottom and determining the location of each cluster. Detail embodiments will be provided below.

Figure 4:
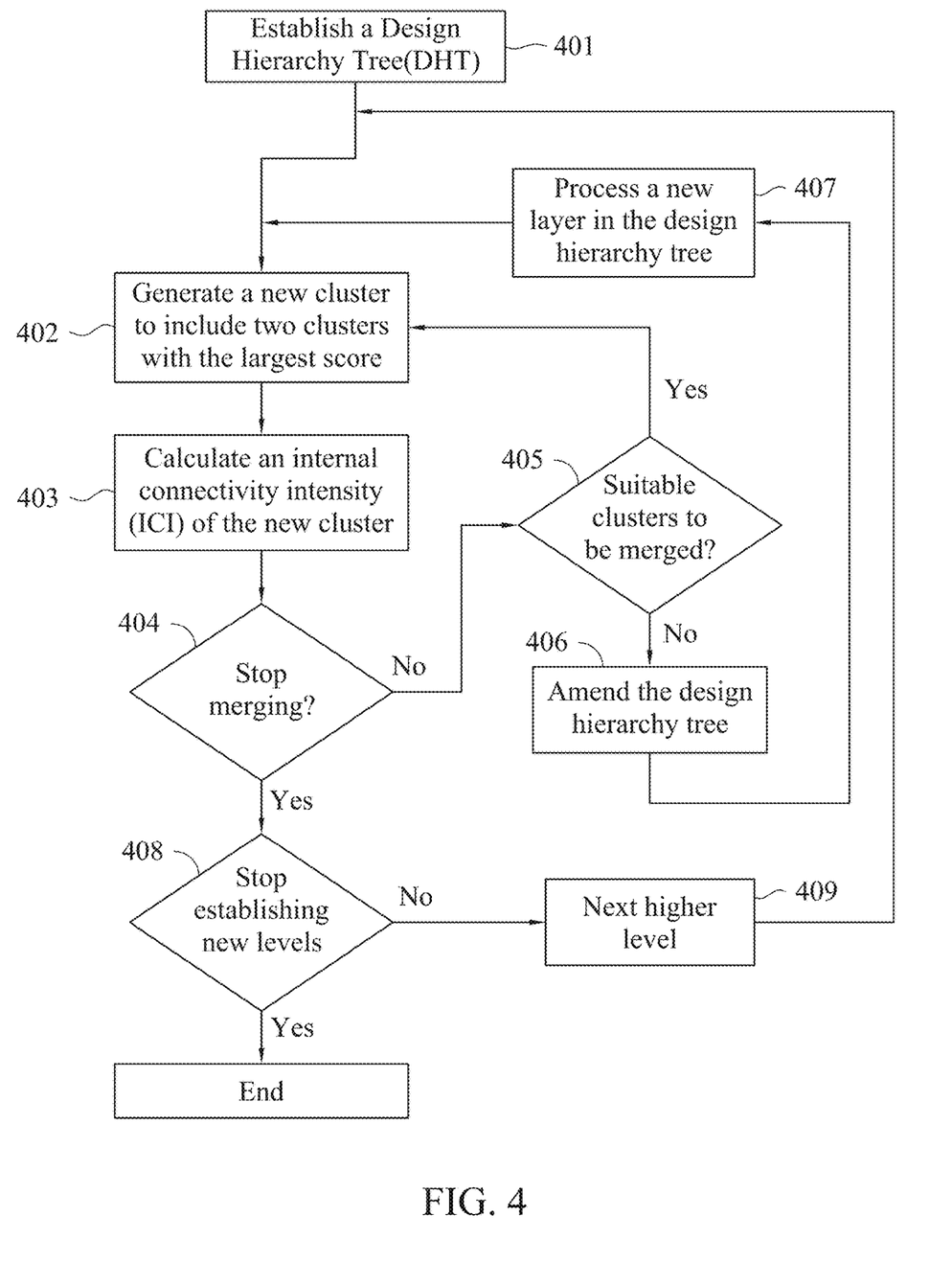
FIG. 4 is a diagram illustrating the procedures of the step 301 in accordance with an embodiment.

FIG. 4 is a diagram illustrating the procedures of the step 301 in accordance with an embodiment. In step 401, a Design Hierarchy Tree (DHT) is established by the reference of Lin, Jai-Ming, Szu-Ting Li, and Yi-Ting Wang. "Routability-driven Mixed-size Placement Prototyping Approach Considering Design Hierarchy and Indirect Connectivity Between Macros." Proceedings of the 56th Annual Design Automation Conference 2019. Let $c_i^l$ denotes a cluster in a level l which is initialized as zero. In the level 0, each cell is taken as a cluster $c_i^0$.

In the step 402, two clusters $c_j^l$ and $c_k^l$ are selected with a largest score $S(c_j^l, c_k^l)$ between the cluster $c_j^l$ and the cluster $c_k^l$, and a new cluster $c_i^l$ is generated to contain the cluster $c_j^l$ and the cluster $c_k^l$. The score is calculated by the following Equation 1.

$$S(c_j^l, c_k^l) = e^{\frac{-(A_j^l + A_k^l)}{\mu \times A_{avg}}} \times \sum_{e_m \in E_{j,k}} \frac{1}{d(e_m) - 1} \quad \text{[Equation 1]}$$

$A_j^l$ denotes the area of the cluster $c_j^l$. $A_k^l$ denotes the area of the cluster $c_k^l$. $A_{avg}$ denotes the average area of all clusters. $\mu$ is a predetermined real number (e.g. determined by the user). $E_{j,k}$ denotes a set of the nets connecting the cluster $c_j^l$ and the cluster $c_k^l$. $e_m$ denotes one of the nets connecting the cluster $c_j^l$ and the cluster $c_k^l$. $d(e_m)$ denotes the number of branches of the net $e_m$. Larger score $S(c_j^l, c_k^l)$ represents that the clusters $c_j^l$, $c_k^l$ have smaller areas and stronger connectivity intensity (i.e. the second term on the right side of the equal sign in Equation 1). In the embodiment, the score $S(c_j^l, c_k^l)$ is negatively related to the areas of the clusters $c_j^l$, $c_k^l$. In particular, the score $S(c_j^l, c_k^l)$ is negatively related to the number of branches $d(e_m)$ because fewer branches of a net represents the corresponding two clusters connects with the each other with fewer routes (i.e. stronger connectivity intensity). In contrast, if the number of branches is large, it means the corresponding two clusters can be connected by multiple routes and therefore the connectivity intensity is relatively weak.

In step 403, an internal connectivity intensity (ICI) of the new cluster is calculated by the following Equation 2.

$$\eta(c_i^l) = S(c_j^l, c_k^l) + \eta(c_j^l) + \eta(c_k^l) \quad \text{[Equation 2]}$$

$\eta(c_i^l)$ denotes the internal connectivity intensity of the new cluster cil. $\eta(c_j^l)$ denotes the internal connectivity intensity of the cluster $c_j^l$. $\eta(c_k^l)$ denotes the internal connectivity intensity of the cluster $c_k^l$. In other words, the internal connectivity intensity of the new cluster is calculated by summing up the internal connectivity intensity of the cluster $C_j^l$, the internal connectivity intensity of the cluster $c_k^l$, and the score $S(c_j^l, c_k^l)$ between these two clusters. When a cluster belongs to the lowest level (i.e. l=0), the internal connectivity intensity of this cluster is equal to zero, and that is $\eta(c_i^0)=0$. Note that larger score $S(c_j^l, c_k^l)$ results in a larger internal connectivity intensity $\eta(c_i^l)$.

In step 404, it is determined whether to stop merging. In some embodiments, it is determined whether to stop merging based on the number of the cluster because this number is getting smaller. For example, it is determined if an inequality $N_l/N'_l>\alpha$ holds where $N_l$ denotes the initial number of the clusters in the level l, $N'_l$ denotes the current number of the clusters, and a denotes a predetermined real number (e.g. 1.7). If the inequality equation holds, then the merging stops to perform step 408, otherwise the merging continues (step 405 is performed).

In the step 405, it is determined if there is suitable clusters to be merged. Based on the algorithm of the design hierarchy tree, only the clusters in the same layer are selected. If the result of the step 405 is "No", then the design hierarchy tree is amended in the step 406, and step 407 is performed to process a new layer in the design hierarchy tree. The detail of the steps 405 to 407 may be referred to the reference of the Design Hierarchy Tree mentioned above.

In the step 408, it is determined whether to stop establishing new levels. In some embodiments, this is also based on the number of the clusters. For example, it is determined if the inequality $N'_l\beta$ holds where denotes a predetermined real number (e.g. $\beta=0.05\times N_0$). If the inequality holds, then the procedure ends, otherwise step 409 is performed to process the next higher level (i.e. l=l+1).

In the embodiments, the clusters are merged based on the Design Hierarchy Tree algorithm, but the clusters may be merged based on any other suitable algorithm as long as the internal connectivity intensity of each cluster is calculated in each level. In other words, another calculation of the score different from the Equation 1 may be adopted when merging the clusters. In addition, the score of merging the clusters may be different from that of calculating the internal connectivity intensity. It is in the spirit of the disclosure as long as the score $S(c_j^l, c_k^l)$ is positively related to the connectivity intensity between these two clusters and negatively related to the number of branches of the nets when calculating the internal connectivity intensity. People in the art should be able to devise another score $S(c_j^l, c_k^l)$ based on the disclosure.

Figure 5:
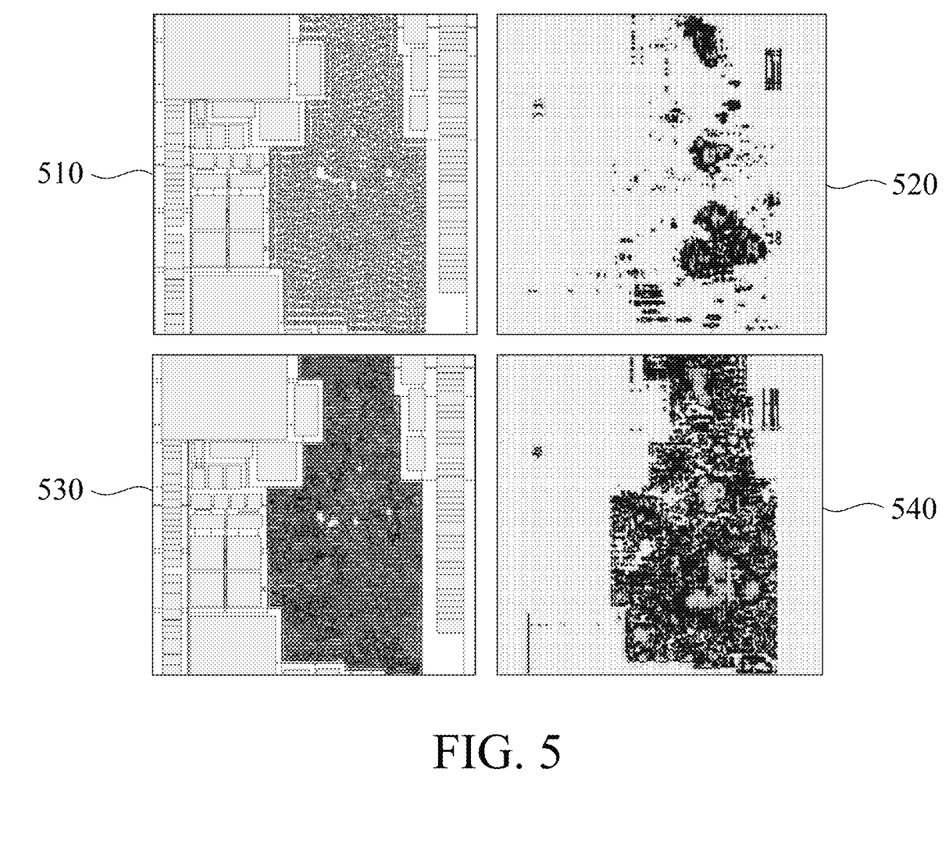
FIG. 5 is a diagram illustrating congestion map and layout in a high level and a low level in accordance with an embodiment.

Next, refinement is performed. In some conventional approaches, inflation technology is used to increase a size of a cell so that the cell may be removed from a congested region to avoid local routing congestion. However, this approach relies on the congestion map which is composed of overflow values of grids of the placement region. However, the congestion map in high levels may not be accurate. FIG. 5 is a diagram illustrating congestion maps and layout in a high level and a low level in accordance with an embodiment. Referring to FIG. 5, a placement region 510 shows layout result in the high level, and a congestion map 520 is also calculated in the high level. A placement region 530 is the layout result in the low level, and a congestion map 540 is calculated in the low level. It is shown in FIG. 5 that there is a significant difference between the congestion map 520 and the congestion map 540 because the congestion inside the clusters is unknown. In the embodiment, the inflation is performed according to the congestion map in addition to the internal connectivity intensities of the clusters to reduce local routing congestion.

Figure 6:
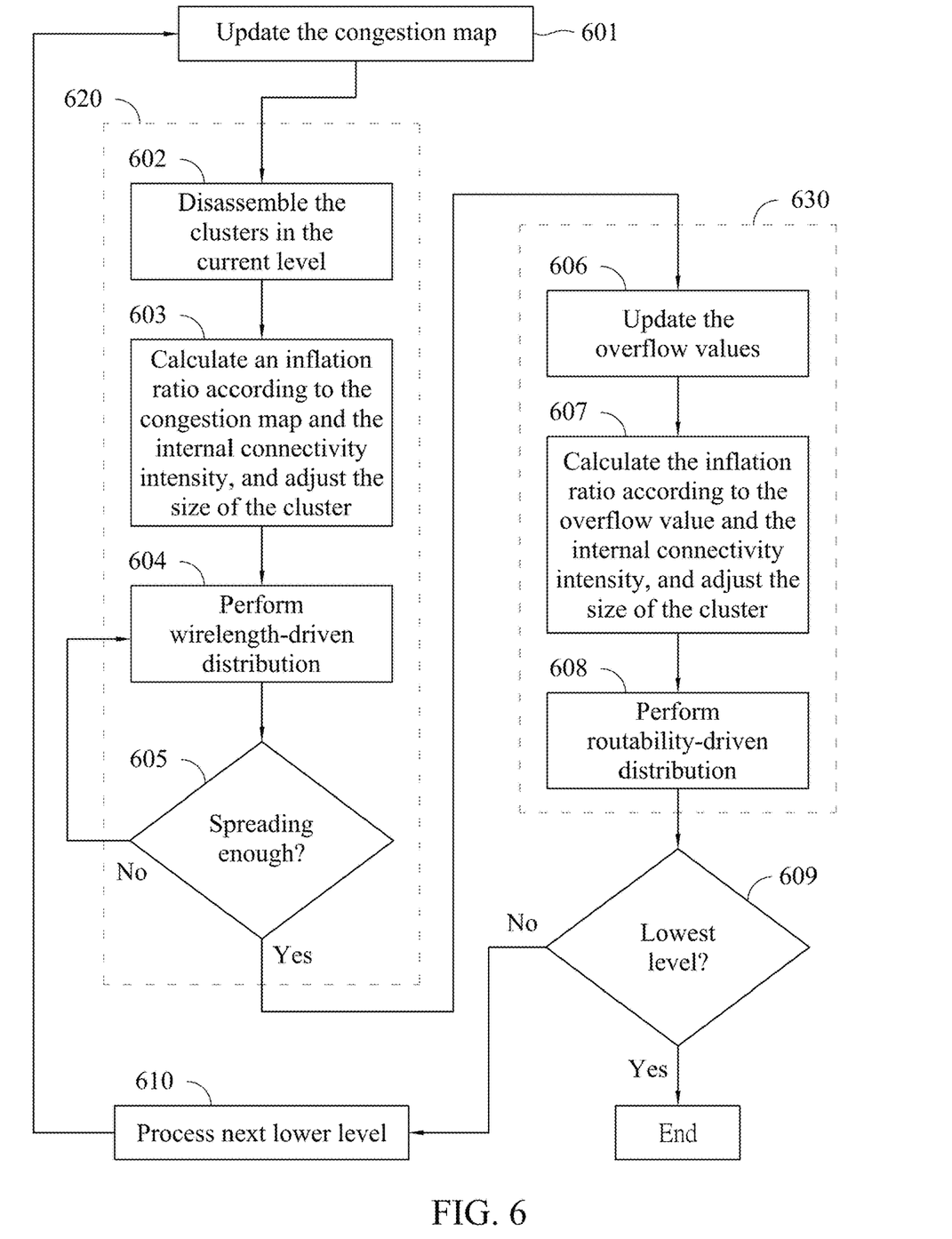
FIG. 6 is a diagram illustrating the procedures of the step 303 in accordance with an embodiment.

FIG. 6 is a diagram illustrating the procedures of the step 303 in accordance with an embodiment. In step 601, the congestion map is updated.

The congestion map includes overflow values of all the grids. The overflow value of a grid is defined as a routing number that the grid needs minus a routing number that the grid provides. The larger the overflow value is, the more the grid is congested. The overflow value of each grid is updated based on the current layout. People in the art should be able to appreciate the congestion map, and therefore the detail thereof is not described herein.

In step 602, the clusters in the current level l are disassembled. In step 603, an inflation ratio of each cluster is calculated according to the congestion map and its internal connectivity intensity. To be specific, the inflation ratio may be calculated based on the following Equations 3-5.

$$\gamma(c_i^l) = \min\left\{\gamma_{min} + \hat{o}(c_i^l) + \frac{l}{N_L} \times \hat{\eta}(c_i^l), \gamma_{max}\right\} \quad \text{[Equation 3]}$$

$$\hat{o}(c_i^l) = \max\left\{\frac{o(c_i^l) - o_T}{o_{max}}, 0\right\} \quad \text{[Equation 4]}$$

$$\hat{\eta}(c_i^l) = \max\left\{\frac{\eta(c_i^l) - \eta_T}{\eta_{max}}, 0\right\} \quad \text{[Equation 5]}$$

$\gamma(c_i^l)$ denotes the inflation ratio of the cluster $c_i^l$. Since the cluster $c_i^l$ may overlap with multiple grids, the grid g having greatest overlapping area with the cluster $c_i^l$ is considered. $o(c_i^l)$ denotes the overflow value of the grid g. $\hat{o}(c_i^l)$ denotes a normalized overflow value. $o_{max}$ denotes the greatest overflow value among all the grids. $\eta(c_i^l)$ denotes the internal connectivity intensity of the cluster $c_i^l$. $\hat{\eta}(c_i^l)$ denotes a normalized internal connectivity intensity. $\eta_{max}$ denotes the greatest internal connectivity intensity among all the clusters. $o_T$, $\eta_T$, $\gamma_{min}$, and $\gamma_{max}$ are predetermined real numbers (e.g. determined by the user). $N_L$ denotes the number of all the levels. In some embodiments, the inflation ratio is limited in the range from 1 to 2, and therefore $\gamma_{min}=1$, and $\gamma_{max}=2$. In some embodiment, $\eta_T$ is twice the average of the internal connectivity intensities of all clusters in the current level l.

Note that $l/N_L$ in the Equation 3 is a weight which is positively related to the current level l. The current level l is decreased during refinement, and therefore the weight is decreased from 1 of the highest level to 0 of the lowest level (each cluster only contains one cell in the lowest level). The weight $l/N_L$ is decreased because there exists more internal connectivity intensity in a cluster in a higher level. However, the overflow values in the high level are less accurate. On the contrary, there exists less internal connectivity intensity in a cluster in a lower level with more accurate overflow values. After the inflation ratio $\gamma(c_i^l)$ is calculated, the size of the cluster $c_i^l$ (i.e. the area the cluster $c_i^l$ occupies in the placement region) is adjusted according to the inflation ratio.

In step 604, a wirelength-driven distribution is performed. In detail, an objective function is established to determine locations of the clusters so that the objective function outputs an optimal value. The objective function is written in the following Equation 6.

$$\min \lambda_1 W(x, y) + \lambda_2 \sum_b (U_b(x, y) - M_b)^2 \qquad \text{[Equation 6]}$$

In the embodiments, the placement region is divided into multiple bins. The size of the bins may be larger, equal, or smaller than that of the grids. W(x, y) denotes a total length of the wires. $U_b(x,y)$ denotes the total area of the cells in the bin b. $M_b$ denotes the maximum allowable area of the cells in the bin b. $\lambda_1$ and $\lambda_2$ are user-specified real numbers. The Equation 6 may be referred to the reference of Chen, Tung-Chieh, et al. "NTUplace3: An analytical placer for large-scale mixed-size designs with preplaced blocks and density constraints." IEEE Transactions on Computer-Aided Design of Integrated Circuits and Systems 27.7 (2008): 1228-1240, and the detail thereof is not described herein.

In step 605, it is determined if spreading is enough. If the result of the step 605 is "yes", step 606 is performed, otherwise the step 604 is performed. In some embodiments, an overflow area of each bin is calculated. The overflow area is defined as the total area of the cells (e.g. clusters) in the bin minus the area of the bin. The less the overflow area is, the less the bin is congested. The total overflow area of all bins is divided by the total area of all movable clusters to obtain an overflow area ratio. If the overflow area ratio is less than a threshold (e.g. 0), then it is determined that the spreading is enough.

In the step 606, the overflow value of each grid is updated. In step 607, for each cluster, an inflation ratio is calculated according to the overflow value of the grid and the internal connectivity intensity of the corresponding clusters, and a size of the cluster is adjusted according to the inflation ratio. The step 607 may be referred to the step 603, and therefore the detail is not repeated herein.

Figure 7:
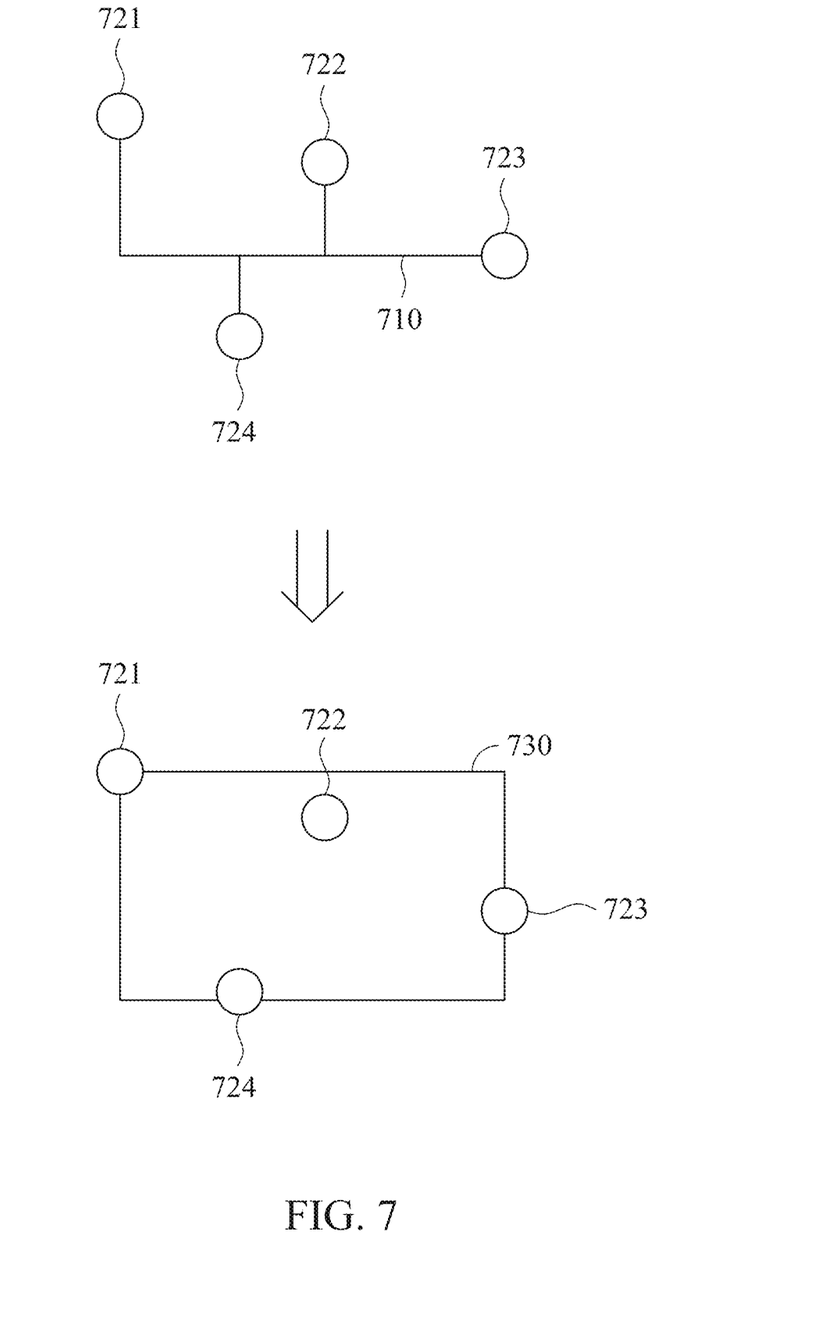
FIG. 7 is a diagram illustrating nets and bounding boxes in accordance with an embodiment.
Figure 8:
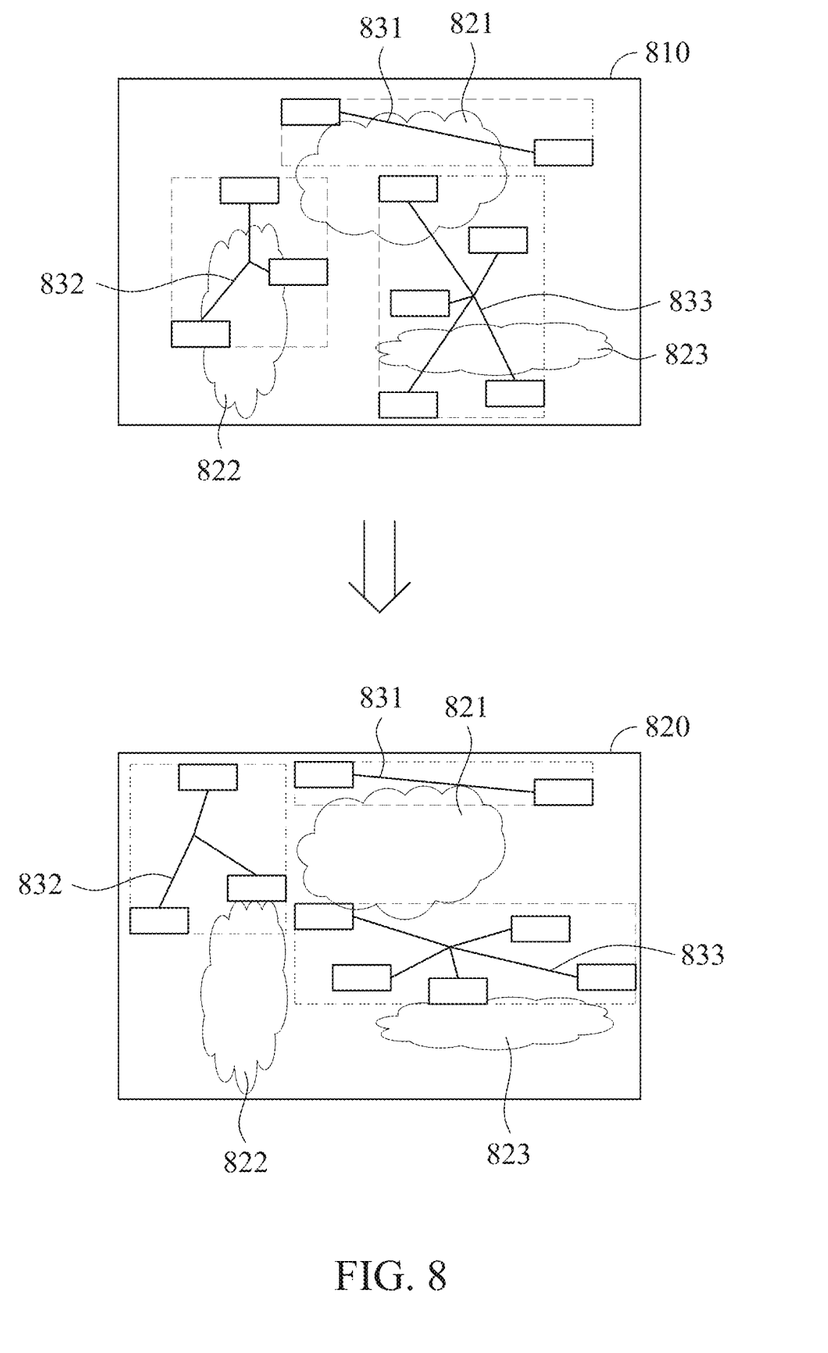
FIG. 8 is a diagram illustrating nets and congestions regions in accordance with an embodiment.

In step 608, a routability-driven distribution is performed. The global routing congestion cannot be solved when only considering the wirelength. In the embodiment, each net is considered as a movable soft bounding box. FIG. 7 is a diagram illustrating nets and bounding boxes in accordance with an embodiment. Referring to FIG. 7, a net 710 connects pins 721-724, and a bounding box 730 is a minimum rectangle to cover all the pins 721-724. In the embodiment, a penalty is given to the region that each net occupies. When the bounding box 730 covers larger or more congested regions, the corresponding net receives larger penalty. The shape and the location of the bounding box 730 will change to move the net to a low congested region. FIG. 8 is a diagram illustrating nets and congested regions in accordance with an embodiment. Referring to FIG. 8, a scenario 810 illustrates a layout based on a conventional approach. The scenario 810 includes three congested regions 821-823 and three nets 831-833. In the embodiment, the shape and location of the nets can change, and accordingly as shown in a scenario 820, the shapes of the nets 831-833 change, and the nets 831-833 are moved to low congested regions.

To be specific, let $n_i$ denotes the $i^{th}$ net. $B_i$ denotes the bounding box corresponding to the net $n_i$. Given a placement, a routing congestion penalty of the net $n_i$ is calculated as the following Equation 7.

$$C_i = \sum_{g_k \in G \cap B_i} \rho_k \times \pi_k \qquad \text{[Equation 7]}$$

Figure 9:
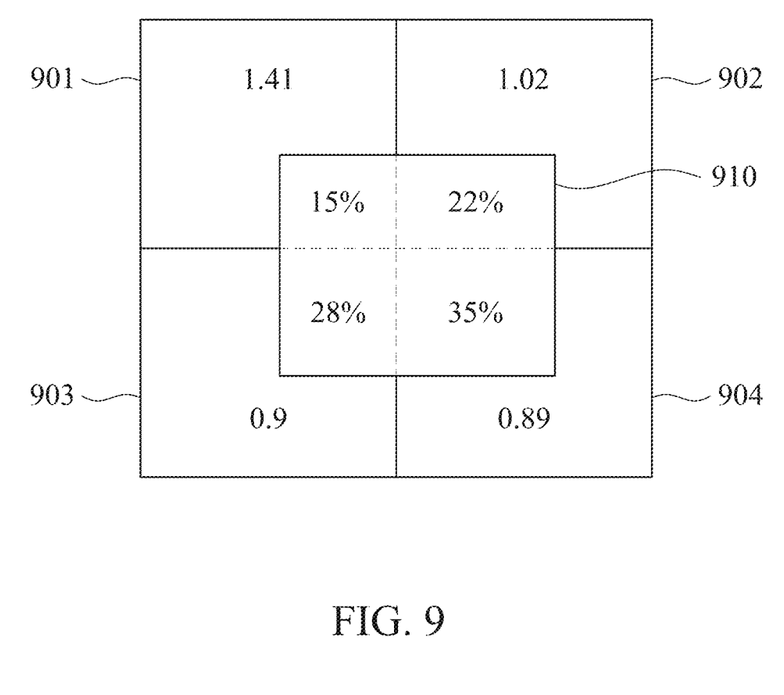
FIG. 9 is a diagram illustrating overlap between the bounding box and the grids in accordance with an embodiment.

$C_i$ denotes the routing congestion penalty of the net $n_i$. G denotes a set including all the grids. $g_k$ denotes the grid covered by the bounding box $B_i$. $\pi_k$ denotes the overflow value of the grid $g_k$. $\rho_k$ denotes a ratio of an overlapping area between the grid $g_k$ and the bounding box $B_i$ to the area of the bounding box $B_i$. For example, FIG. 9 is a diagram illustrating overlap between the bounding box and the grids in accordance with an embodiment. Referring to FIG. 9, four grids 901-904 are shown in which the overflow value of the grid 901 is equal to 1.41, the overflow value of the grid 902 is equal to 1.02, the overflow value of the grid 903 is equal to 0.9, and the overflow value of the grid 904 is equal to 0.89. The bounding box 910 is overlapped with the grids 901-904 in which 15% of the area of the bounding box 910 is overlapped with the grid 901, 22% of the area of the bounding box 910 is overlapped with grid 902, 28% of the area of the bounding box 910 is overlapped with the grid 903, and 35% of the area of the bounding box 910 is overlapped with the grid 904. Therefore, the routing congestion penalty of the net $n_i$ corresponding to the bounding box 910 is calculated as 0.15×1.41+0.22×1.02+0.28×0.9+ 0.35×0.89=0.9994. When the net $n_i$ covers more congested regions, it receives larger penalty. In other words, the routing congestion penalty servers as routability. The larger the routing congestion penalty is, the lower the routability is. In order to present the Equation 7 by the coordinates of cells, we transform the Equation 7 into the following Equation 8.

$$C_i(x, y) = \sum_{g_k \in G} \Phi(B_i, g_k) \qquad \text{[Equation 8]}$$

$\Phi(B_i, g_k)$ denotes the penalty contributed by any grid $g_k$. $\Phi(B_i, g_k)$ can be calculated as the following Equation 9.

$$\Phi(B_i, g_k) = \frac{P_x(B_i, g_k) \times P_y(B_i, g_k)}{\sum_{g_k \in G} P_x(B_i, g_k) \times P_y(B_i, g_k)} \times \pi_k \qquad \text{[Equation 9]}$$

$P_x(B_i, g_k)$ denotes the width of the overlapping are between the bounding box $B_i$ and the grid $g_k$. $P_y(B_i, g_k)$ denotes the height of the overlapping are between the bounding box $B_i$ and the grid $g_k$. Since $P_x(B_i, g_k)$ and $P_y(B_i, g_k)$ cannot be differentiated, they are replaced by $\hat{P}_x(B_i, g_k)$ and $\hat{P}_y(B_i, g_k)$ according to the bell-shaped potential function as the following Equation 10 and 11. Without loss of generality, only $\hat{P}_x(B_i, g_k)$ is illustrated. $\hat{P}_y(B_i, g_k)$ can be done similarly.

[Equation 10]
$$\hat{P}_x(B_i, g_k) = \begin{cases} 1 - ad_x^2, & 0 \le d_x \le w_{B_i}/2 + w_{g_k} \\ b(d_x - w_{B_i}/2 - 2w_{g_k})^2, & w_{B_i}/2 + w_{g_k} \le d_x \le w_{B_i}/2 + w_{g_k} \\ 0, & w_{B_i}/2 + 2w_{g_k} \le d_x \end{cases}$$

$$a = 4/(w_{B_i} + 2w_{g_k})(w_{B_i} + 4w_{g_k}) \qquad \text{[Equation 11]}$$

$$b = 2/w_{g_k}(w_{B_i} + 4w_{g_k})$$

$d_x$ denotes the distance between the center of the bounding box $B_i$ and the center of the grid $g_k$ in the x-axis. $w_{Bi}$ denotes the width of the bounding box $B_i$. $w_{gk}$ denotes the width of the grid $g_k$. To compute the distance $d_x$, we have to get the center coordinate of the bounding box $B_i$, which is denoted by $(x_{Bi}, y_{Bi})$. $x_{Bi}$ is computed by the following Equation 12, and the width $w_{Bi}$ is computed by the following Equation 13.

$$x_{B_i} = \frac{\max_{v_k \in n_i} x_k + \min_{v_k \in n_i} x_k}{2} \quad \text{[Equation 12]}$$

$$w_{B_i} = \max_{v_k \in n_i} x_k - \min_{v_k \in n_i} x_k \quad \text{[Equation 13]}$$

$v_k$ denotes a cell of the net $n_i$. $x_k$ denotes the x-coordinate of the center of the cell $v_k$. Because the function $\max_{ck \in ni} x_k$ and $\min_{ck \in ni} x_k$ are not differentiable, we apply the log-sum-exp function to compute the value.

According to the aforementioned disclosure, the objective function established in the step 608 is written in the following Equation 14.

$$\min \lambda_1 W(x, y) + \lambda_2 \sum_b (U_b(x, y) - M_b)^2 + \lambda_3 C(x, y) \quad \text{[Equation 14]}$$

The difference between the Equation 14 and the Equation 6 is routing congestion penalty $C(x,y)$ which is defined in the following Equation 15.

$$C(x, y) = \sum_{n_i \in \Psi} C_i(x, y) \quad \text{[Equation 15]}$$

$\Psi$ denotes a list (i.e. set) including all the nets. In some embodiments, $\lambda_1$ and $\lambda_2$ are set according to the following Equations 16 and 17. $\lambda_3$ is a predetermined real number (e.g. determined by the user) such as 1 in some embodiments.

$$\lambda_1 = \frac{\sum |\partial C(x, y)|}{\sum |\partial W(x, y)|} \quad \text{[Equation 16]}$$

$$\lambda_2 = \frac{\sum |\partial C(x, y)|}{\sum |\partial U_b(x, y)|} \quad \text{[Equation 17]}$$

In some embodiments, to make the cells evenly distributed over the placement region, $\lambda_1$ and $\lambda_3$ are fixed, and $\lambda_2$ is increased (e.g. double) every iteration. In some embodiments, the Equation 14 may be solved for computing the coordinates x and y of every cluster by a conjugate gradient (CG) approach so that the objective function output an optimal value (e.g. minimum in the embodiment), but how the Equation 14 is solved is not limited in the disclosure.

In step 609, it is determined if the current level is the lowest level, then then procedure ends if the result is "yes", otherwise step 610 is performed to process the next lower level (i.e. l=l−1).

The steps 603-605 may be collectively referred to a second placement procedure 620, and the steps 606-608 may be collectively referred to a first placement procedure 630. The objective function of the step 608 includes the routing congestion penalty $C(x,y)$, but the objective function of the step 604 does not include the routing congestion penalty. This is because the clusters are located nearby in the initial stage and thus the routing congestion penalty cannot be considered. The wirelength-driven distribution is performed first to spread the clusters in the initial stage. The disclosure is not limited to the flow chart of FIG. 6, any suitable objective function may be adopted in the step 604 or the second placement procedure 620 may be omitted. In addition, the disclosure is not limited to the objective function of Equation 14, other objective functions may be adopted as long as it includes the routing congestion penalty $C(x, y)$.

From another aspect, a non-transitory computer readable storage media is provided. The media may be a random access memory, a read-only memory, a flash memory, floppy disks, hard disks, CD-ROMs, pen drives, tapes, databases accessible via the Internet for storing instructions which are configured to be executed to perform the placement method.

The characteristics of the disclosure at least include: 1) We target on global and local routing congestion and use different strategies to resolve the problems in the multilevel framework; 2) We propose a congestion-aware net penalty model to reduce global congestion; 3) We propose a novel inflation technique by considering the internal connectivity intensity of a cluster as well as the congestion value occupied by the cluster to alleviate local congestion.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A placement method of integrated circuit design for a computer system, wherein a placement region is divided into a plurality of grids, a plurality of cells form a plurality of nets, each of the nets connects at least two of the cells, and the placement method comprises:
   taking the cells as a plurality of clusters, and merging the clusters in each of a plurality of levels from bottom to up;
   performing an initial placement; and
   disassembling the clusters in each of the levels from the up to the bottom and performing a first placement procedure comprising:
      setting a bounding box for each of the nets, wherein the bounding box covers at least one first grid of the grids;
      for each of the nets, calculating a routing congestion penalty according to an overlapping area between the bounding box and the at least one first grid and an overflow value of the at least one first grid; and
      establishing a first objective function according to the routing congestion penalties of the nets to determine locations of the clusters so that the first objective function outputs a first optimal value.

2. The placement method of claim 1, wherein merging the clusters comprises:
   generating a new cluster to contain a first cluster and a second cluster of the clusters; and
   summing up an internal connectivity intensity of the first cluster, an internal connectivity intensity of the second cluster, and a score between the first cluster and the second cluster to obtain an internal connectivity intensity of the new cluster, wherein the score is negatively related to a number of branches between first cluster and the second cluster.

3. The placement method of claim 2, wherein when the first cluster or the second cluster belongs to a lowest level of levels, the corresponding internal connectivity intensity is equal to 0, wherein the score is also negatively related to an area of the first cluster and an area of the second cluster.

4. The placement method of claim 3, wherein the first placement procedure further comprises:
updating the overflow value of each of the grids; and
for each of the clusters, obtaining a second grid of the grids that has a greatest overlapping area with the cluster, calculating an inflation ratio according to the overflow value of the second grid and the internal connectivity intensity of the cluster, and adjusting a size of the cluster according to the inflation ratio.

5. The placement method of claim 4, wherein the first placement procedure further comprises:
when calculating the inflation ratio, multiplying the internal connectivity intensity of the corresponding cluster by a weight which is positively related to a current level of the levels.

6. The placement method of claim 5, wherein the inflation ratio is calculated by following equations:

$$\gamma(c_i^l) = \min\left\{\gamma_{min} + \hat{o}(c_i^l) + \frac{l}{N_L} \times \hat{\eta}(c_i^l),\ \gamma_{max}\right\}$$

$$\hat{o}(c_i^l) = \max\left\{\frac{o(c_i^l) - o_T}{o_{max}},\ 0\right\}$$

$$\hat{\eta}(c_i^l) = \max\left\{\frac{\eta(c_i^l) - \eta_T}{\eta_{max}},\ 0\right\}$$

wherein l is the current level, $c_i^l$ is an $i^{th}$ cluster in the current level, $\gamma(c_i^l)$ is the inflation ratio of the cluster $c_i^l$, $N_L$ is a number of the levels,
wherein $\gamma_{min}$, $\gamma_{max}$, $o_T$ and $\eta_T$, are predetermined real values,
wherein $o(c_i^l)$ is the overflow value of the second grid corresponding to the cluster $c_i^l$, $\eta(c_i^l)$ is the internal connectivity intensity of the cluster $c_i^l$, $o_{max}$ is a greatest overflow value among the grids, and $\eta_{max}$ is a greatest internal connectivity intensity among the clusters.

7. The placement method of claim 6, further comprising:
performing a second placement procedure before the first placement procedure, wherein the second placement procedure comprises:
for each of the cluster, calculating a second inflation ratio of the cluster, and adjusting the size of the cluster according to the second inflation ratio; and
establishing a second objective function to determine the locations of the clusters so that the second objective function outputs a second optimal value, wherein the second objective function does not contain the routing congestion penalties.

8. The placement method of claim 1, wherein the routing congestion penalty of each of the nets is calculated by a following equation:

$$C_i = \sum_{g_k \in G \cap B_i} \rho_k \times \pi_k$$

wherein $C_i$ is the routing congestion penalty of an $i^{th}$ net of the nets, $B_i$ is the bounding box of the $i^{th}$ net, G is a set formed by the grids, $g_k$ is the at least one first grid that is covered by the bounding box $B_i$,
wherein $\rho_k$ is a ratio of the overlapping area between the at least one first grid $g_k$ and the bounding box $B_i$ to an area of the bounding box $B_i$, and $\pi_k$ is the overflow value of the at least one first grid $g_k$.

9. A non-transitory computer readable storage media for storing a plurality of instructions, wherein the instructions are configured to be executed to perform the placement method of claim 1.

* * * * *